(12) United States Patent
Shin et al.

(10) Patent No.: US 11,329,595 B2
(45) Date of Patent: May 10, 2022

(54) ERROR DETERMINING APPARATUS AND METHOD FOR VEHICLE MOTOR

(71) Applicants: Hyundai Motor Company, Seoul (KR); Kia Motors Corporation, Seoul (KR)

(72) Inventors: Ho Joon Shin, Gyeonggi-do (KR); Heon Young Kwak, Gyeonggi-do (KR); Hong Geuk Park, Chungcheongnam-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/953,717

(22) Filed: Nov. 20, 2020

(65) Prior Publication Data

US 2021/0384861 A1 Dec. 9, 2021

(30) Foreign Application Priority Data

Jun. 3, 2020 (KR) .................. 10-2020-0067234

(51) Int. Cl.
*H02P 29/024* (2016.01)
*G01R 31/54* (2020.01)
*G01R 31/00* (2006.01)
*G01R 31/34* (2020.01)
*G07C 5/08* (2006.01)
*H02P 27/06* (2006.01)

(52) U.S. Cl.
CPC .......... *H02P 29/024* (2013.01); *G01R 31/007* (2013.01); *G01R 31/343* (2013.01); *G01R 31/54* (2020.01); *G07C 5/0808* (2013.01); *H02P 27/06* (2013.01)

(58) Field of Classification Search
CPC ..... H02P 29/024; H02P 27/06; G01R 31/007; G01R 31/343; G07C 5/0808
See application file for complete search history.

(56) References Cited

U.S. PATENT DOCUMENTS

| | | | |
|---|---|---|---|
| 2015/0168476 A1* | 6/2015 | Park | G01R 31/52 324/549 |
| 2017/0338746 A1* | 11/2017 | Chen | H02M 3/33592 |
| 2018/0156847 A1* | 6/2018 | Nakamura | G01R 1/203 |
| 2018/0337591 A1* | 11/2018 | Shen | H02M 3/33507 |
| 2018/0367045 A1* | 12/2018 | Zhang | H02M 3/33523 |
| 2019/0252970 A1* | 8/2019 | Ohdaira | H02M 7/53871 |

FOREIGN PATENT DOCUMENTS

| | | | | |
|---|---|---|---|---|
| DE | 102018127247 A1 * | 5/2019 | ......... | G01R 31/2829 |
| JP | 6269040 B2 | 1/2018 | | |
| KR | 10-1473397 B1 | 12/2014 | | |
| KR | 10-1628401 B1 | 6/2016 | | |

* cited by examiner

*Primary Examiner* — Daniel R Miller
(74) *Attorney, Agent, or Firm* — Mintz Levin Cohn Ferris Glovsky and Popeo, P.C.; Peter F. Corless

(57) ABSTRACT

An error determining apparatus of a driving device including a motor and a 3-phase inverter supplying power to the motor through a 3-phase cable may include a resistor provided in each phase of the 3-phase cable, a voltage sensing device sensing voltage of opposite ends of the resistor by a current flowing into the resistor, and a sensing controller determining whether the resistor is faulty or whether the 3-phase cable is opened, based on the sensing voltage of the voltage sensing device and a 3-phase current sum of the 3-phase inverter.

12 Claims, 12 Drawing Sheets

ERROR DETERMINING APPARATUS AND METHOD FOR VEHICLE MOTOR

CROSS-REFERENCE TO RELATED APPLICATION

This application claims under 35 U.S.C. § 119(a) the benefit of Korean Patent Application No. 10-2020-0067234, filed in the Korean Intellectual Property Office on Jun. 3, 2020, the entire contents of which are incorporated herein by reference.

BACKGROUND

(a) Technical Field

The present disclosure relates to an error determining apparatus and an error determining method for a vehicle motor, more particularly, to the error determining apparatus of an inverter used to drive the vehicle motor, and an error determining method.

(b) Description of the Related Art

Generally, to control and drive a DC brushed motor by feeding back a current of the DC brushed motor, it is necessary to detect a driving current or a feedback current. In particular, in the case of a method of controlling detection of the feedback current that operates by feeding back the current of the motor, it is necessary for more accurate and stabilized detection circuits or devices.

To detect the current of such the motor, a hall-type current sensing method is widely used. The hall current sensing is a method of estimating a current magnitude by measuring the magnetic flux generated by a current flowing in a conducting wire.

FIGS. 1A to 1C are views for describing an error determining method of hall current sensing. A hall current sensor is a sensor that senses a current by sensing the current flowing into a hall element connected to a magnetic core and outputting a sensing voltage by sensing the current.

For example, when the hall current sensor fails, it is possible to determine an error because the sensor output voltage is out of the normal range due to the disconnection/short error of the sensor.

The current sensor may detect (−) maximum~(+) maximum current, which may be measured by converting the current into the voltage of 0 V to 5 V based on the sensing voltage. For example, 0 A may be measured as 2.5 V.

FIG. 1A is a view for describing a point in time when a hall sensor is opened. FIG. 1B is a view for describing a point in time when a hall sensor is shorted.

Errors illustrated in FIGS. 1A and 1B may occur in a sensing circuit; when a hall sensor is opened as illustrated in FIG. 1A, the sensing voltage of 5 V that is a maximum saturation voltage may be output; when the hall sensor is shorted as illustrated in FIG. 1B, the sensing voltage of 0 V may be output.

The errors at a point in time when a hall sensor is opened or shorted have no electrical effect on a power circuit, such as a motor and an inverter that drives the motor.

In the meantime, FIG. 1C is a view for describing a point in time when a cable connected to a power circuit such as a motor and an inverter is opened.

When a cable is opened as illustrated in FIG. 1C, the actual current may not flow because the power circuit is electrically separated, and thus the sensing current is also 0 A. Such the cable open error may be determined as a cable open when a current is fixed to 0 A in a current control mode where the current reference is not 0 A.

Because a method using such the hall-type current sensor is a method of sensing the magnetic field generated by a current, the responsiveness is reduced due to poor accuracy when the method is disturbed by an external magnetic field. Accordingly, the cost of a part may also be increased.

Meanwhile, in terms of effectively responding to large current and reducing costs, the method has been recently changed from hall current sensing to shunt resistor current sensing.

When an error occurs in a shunt resistor current sensor, it is difficult to apply the determination of the error in the same scheme as the hall current sensor due to the phenomenon that the output voltage of a sensing circuit is fixed to a value (2.5 V) corresponding to '0 A' or the minimum/maximum voltage is repeated.

Accordingly, it is necessary to consider the operating feature of the shunt resistor current sensor and at the same time, there is a need for a current sensor error determining method capable of being distinguished from the conventional error determination.

SUMMARY

An aspect of the present disclosure provides an error determining apparatus capable of determining an error and the reason thereof in consideration of the operating feature of a shunt resistor current sensor, and an error determining method.

An aspect of the present disclosure provides an error determining apparatus capable of solving the incorrect determination overlapping with a method of determining the cutout of a cable connected to a motor or inverter, and an error determining method.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, an error determining apparatus of a driving device including a motor and a 3-phase inverter supplying power to the motor through a 3-phase cable may include a resistor provided in each phase of the 3-phase cable, a voltage sensing device sensing voltage of opposite ends of the resistor by a current flowing into the resistor, and a sensing controller determining whether the resistor is faulty or whether the 3-phase cable is opened, based on the sensing voltage of the voltage sensing device and a 3-phase current sum of the 3-phase inverter.

The sensing controller may determine whether the resistor is faulty or whether the 3-phase cable is opened, based on whether the sensing voltage is within a predetermined error voltage range.

The sensing controller may determine that the resistor is opened when the sensing voltage is out of a predetermined normal range.

The sensing controller may determine that the resistor is normal when the sensing voltage is maintained as a value that is out of the error voltage range within a predetermined normal range.

The sensing controller may determine that the resistor is shorted when the sensing voltage is maintained as a value within the error voltage range and the 3-phase current sum is not equal to zero.

The sensing controller may determine that a cable including a resistor having the sensing voltage in the 3-phase cable is opened, when the sensing voltage is maintained as a value within the error voltage range and the 3-phase current sum is equal to zero.

According to an aspect of the present disclosure, an error determining method of a driving device including a motor and a 3-phase inverter supplying power to the motor through a 3-phase cable may include steps of: sensing, by a voltage sensing device, voltage of opposite ends of a resistor provided in each phase of the 3-phase cable by a current flowing into the resistor; and determining, by a sensing controller, whether the resistor is faulty or whether the 3-phase cable is opened, based on the sensed sensing voltage and a 3-phase current sum of the 3-phase inverter.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1A:
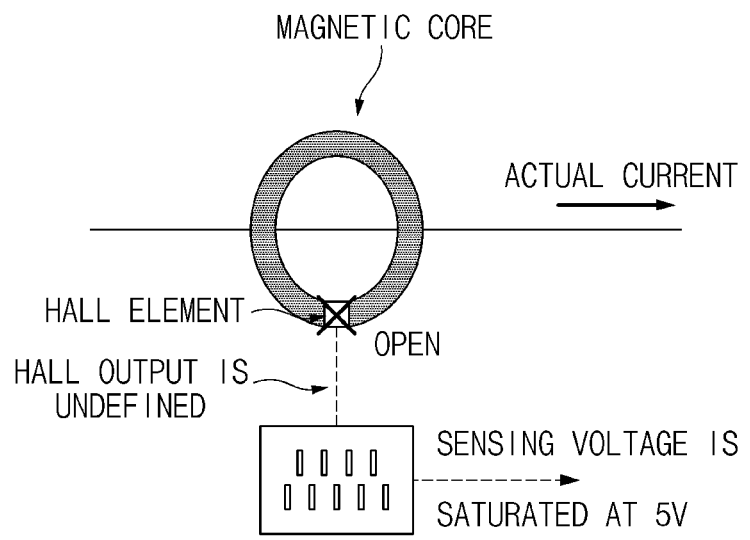
FIG. 1A is a view for describing a point in time when a hall sensor is opened.
Figure 1B:
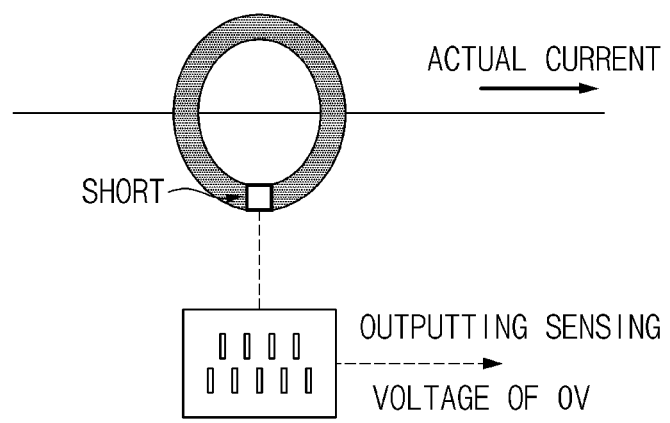
FIG. 1B is a view for describing a point in time when a hall sensor is shorted.
Figure 1C:
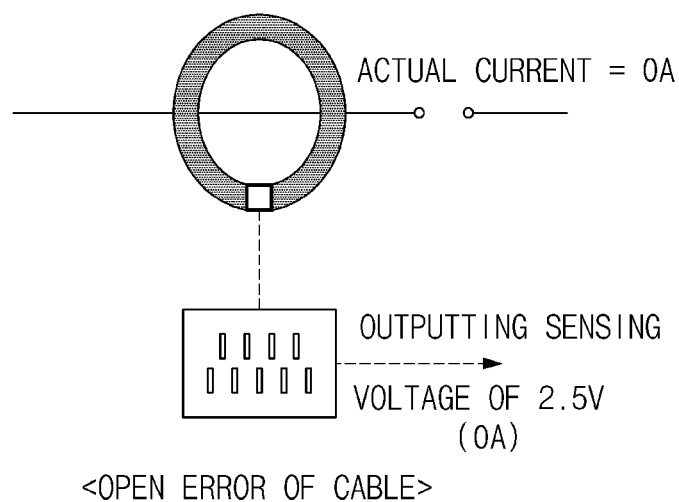
FIG. 1C is a view for describing a point in time when a cable connected to a power circuit such as a motor and an inverter is opened.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of well-known features or functions will be ruled out in order not to unnecessarily obscure the gist of the present disclosure.

In describing the components of the embodiment according to the present disclosure, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Below, various embodiments of the present disclosure will be described in detail with reference to FIGS. 2 to 6.

Figure 2:
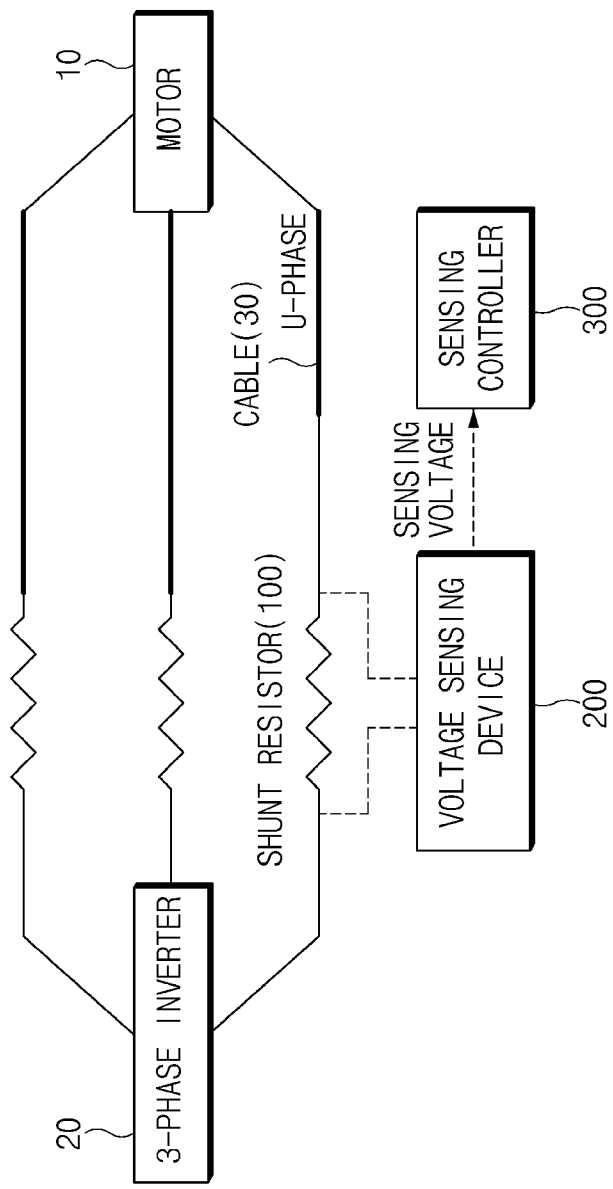
FIG. 2 is a control block diagram of an error determining apparatus according to an embodiment of the present disclosure.

FIG. 2 is a control block diagram of an error determining apparatus according to an embodiment of the present disclosure.

As illustrated in FIG. 2, the error determining apparatus may determine the error of a driving device including a motor 10, a 3-phase cable 30, and a 3-phase inverter 20 that supplies power to the motor 10 through the 3-phase cable 30; the error determining apparatus may include a shunt resistor 100 connected to each phase of the 3-phase cable 30. The current flowing into the shunt resistor 100 may be sensed as an output voltage by a voltage sensing device 200; the sensing controller 300 may determine whether the shunt resistor 100 fails or whether the cable 30 is opened, based on the sensing voltage of the voltage sensing device 200 and the sum of 3-phase currents of the inverter.

The shunt resistor 100 according to an embodiment may be connected to each of the three phases of the 3-phase inverter 120. Hereinafter, the shunt resistor 100 connected to U-phase will be described as an example.

The cable 30 may be connected between the shunt resistor 100 and the driving device; the voltage sensing device 200 may determine an abnormal condition according to current detection of the driving device, that is, an error, by sensing the current flowing into the shunt resistor 100 and the cable 30.

As illustrated in FIG. 2, a shunt resistor current sensor (shunt resistor sensor) measures the current through the voltage of opposite ends of the shunt resistor 100 by connecting a resistor between wires to flow the current into the resistor.

As compared to the hall-type current sensor disturbed by an external magnetic field due to the method of sensing the magnetic field generated by a current, using the shunt resistor 100 has the advantage of high accuracy and high responsiveness. Furthermore, the cost of a part is also lower than that of the hall sensor, and thus the shunt resistor 100 is widely used to sense a current.

The current sensing by the shunt resistor 100 connected to the driving device will be described as follows.

Figure 3A:
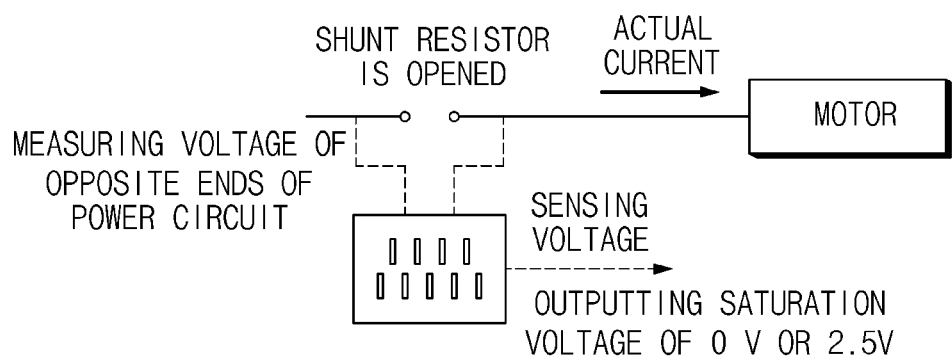
FIG. 3A is a view for describing a point in time when a shunt resistor is opened, according to an embodiment of the present disclosure.
Figure 3B:
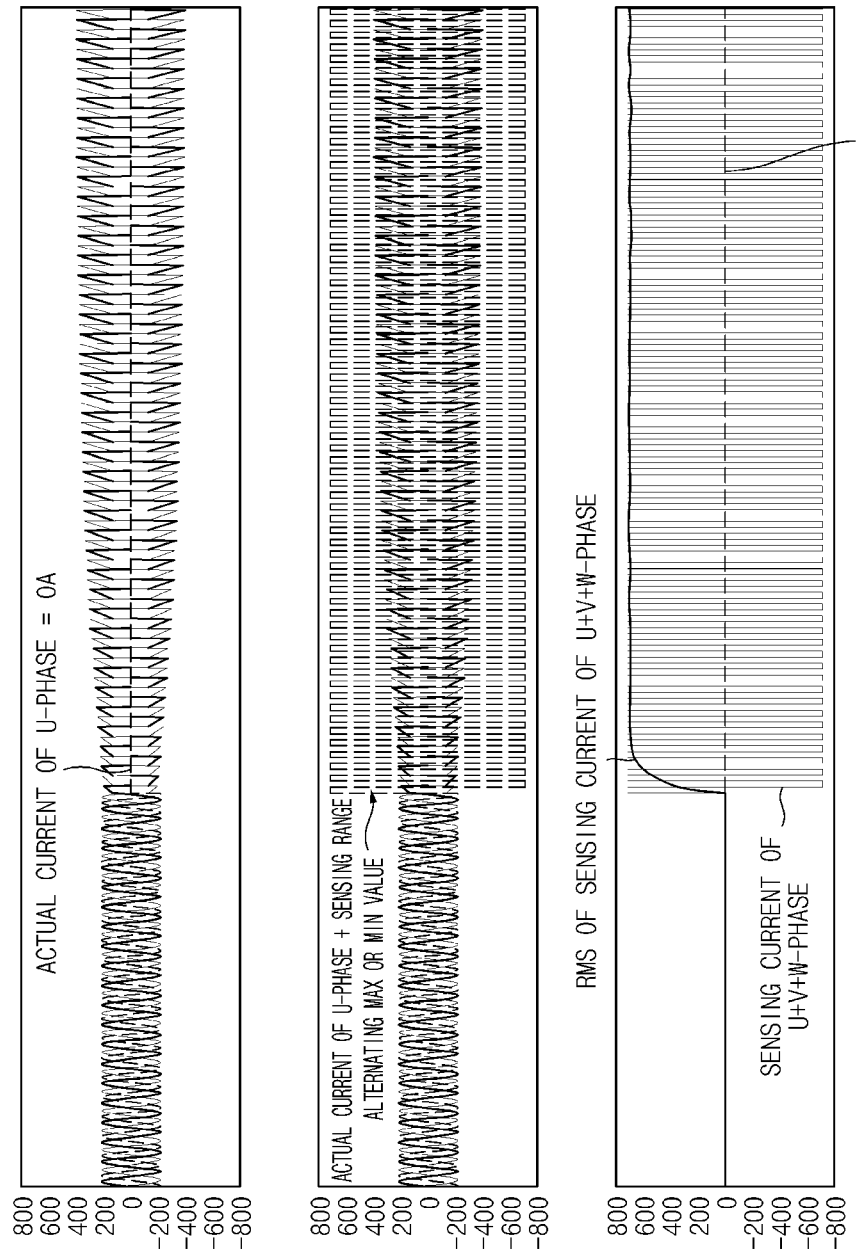
FIG. 3B is a view illustrating an inverter current when the shunt resistor of FIG. 3A is opened.

FIG. 3A is a view for describing a point in time when a shunt resistor is opened, according to an embodiment of the present disclosure. FIG. 3B is a view illustrating an inverter current when the shunt resistor of FIG. 3A is opened.

As illustrated in FIG. 3A, when the shunt resistor 100 is opened, an actual power circuit, that is, a driving device is opened. Accordingly, the actual current of the phase of the opened inverter is also 0 A. In this case, as the shunt resistor 100 is opened, the differential input of the voltage sensing device 200, that is, the sensing circuit is determined as "the output voltage of the inverter−the counter electromotive force of the motor".

When the voltage (the output voltage of the inverter−the counter electromotive force of the motor) is applied to the sensing circuit, the voltage is out of a normal sensing voltage range (0.5~4.5 V), and thus the sensing voltage is out of a normal range. Accordingly, the sensing voltage appears abnormal (e.g., alternating the value of 0 V or 5 V).

FIG. 3B illustrates a current waveform when the U-phase shunt resistor 100 is opened.

As illustrated in the first waveform, the actual current of U-phase becomes 0 A due to the opening of the shunt resistor 100; the sum of actual 3-phase currents becomes zero according to Kirchhoff's law.

However, as illustrated in the second waveform, the sensing current ias_SH of U-phase has the form of alternating the maximum value and the minimum in the sensing range, not 0 A. As illustrated in Equation 1 below, the sum of sensing currents is 'ias_SH−ias', not 0 A.

Actual 3-phase current sum=$ias+ibs+ics=0(ibs+ics=-ias)$

Sensing 3-phase current sum=$ias\_SH+ibs\_SH+ics\_SH \approx ias\_SH-ias$ [Equation 1]

Because the sensing 3-phase current sum in Equation 1 is 'ias_SH−ias', as illustrated in the last waveform of FIG. 3B, the sensing 3-phase current sum has a positive value upon measuring RMS.

That is, as illustrated in FIG. 3A, when the shunt resistor 100 is opened, the actual current of U-phase is 0 A However, the sensing voltage has the form of alternating the maximum values and the minimum value that are out of the predetermined nominal range voltage. It may be determined that the shunt resistor 100 is opened, through such the waveform.

Figure 4A:
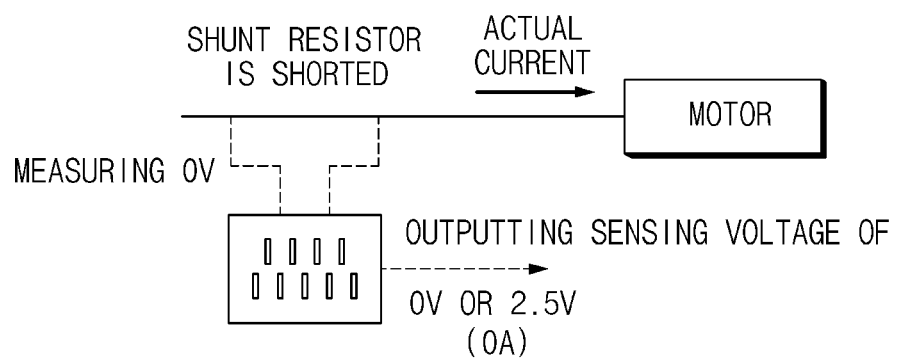
FIG. 4A is a view for describing a point in time when a shunt resistor is shorted, according to an embodiment of the present disclosure.
Figure 4B:
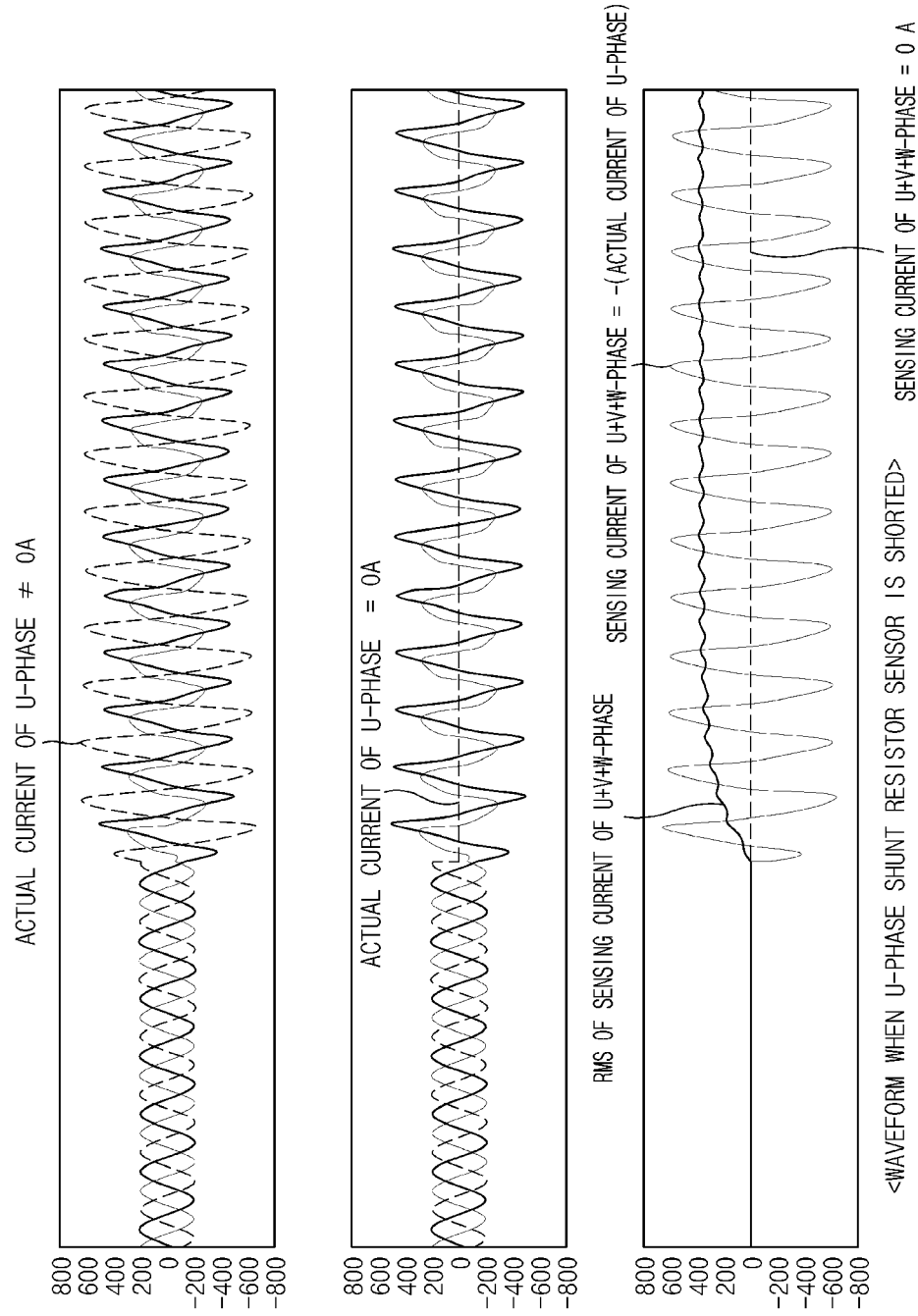
FIG. 4B is a view illustrating an inverter current when the shunt resistor of FIG. 4A is shorted.

FIG. 4A is a view for describing a point in time when a shunt resistor is shorted, according to an embodiment of the present disclosure. FIG. 4B is a view illustrating an inverter current when the shunt resistor of FIG. 4A is shorted.

As illustrated in FIG. 4A, when the shunt resistor 100 is shorted, the actual power circuit, that is, a driving device is shorted. Accordingly, the actual current flows into the shorted phase.

As the shunt resistor 100 is shorted, the differential input of the voltage sensing device 200, that is a sensing circuit is also electrically shorted, and thus the sensing current of the corresponding phase is always 0 A. That is, in this case, the current may actually flow into the shunt resistor 100, but the sensing current may become 0 A; the sensing voltage may be output in a predetermined range or as a predetermined value (e.g., 2.5 V) corresponding thereto.

FIG. 4B illustrates a current waveform when the U-phase shunt resistor 100 is shorted.

Like the first and second waveforms, the sensing current value is 0 A due to the short of the shunt resistor 100; however, the actual current of U-phase is '−ias', not 0 A.

That is, as illustrated in the second waveform, the sensing current ias_SH of the U-phase appears as '−ias', not 0 A; according to Kirchhoff's law, the current sum of three phases becomes 0, and thus Equation 2 is established.

Actual 3-phase current sum=$ias+ibs+ics=0(ibs+ics=-ias)$

Sensing 3-phase current sum=$ias\_SH+ibs\_SH+ics\_SH \approx 0+ibs+ics=-ias$ [Equation 2]

Because the sensing 3-phase current sum in Equation 2 is equal to—"actual U-phase current" RMS is positive as illustrated in the last waveform in FIG. 4B.

Figure 5A:
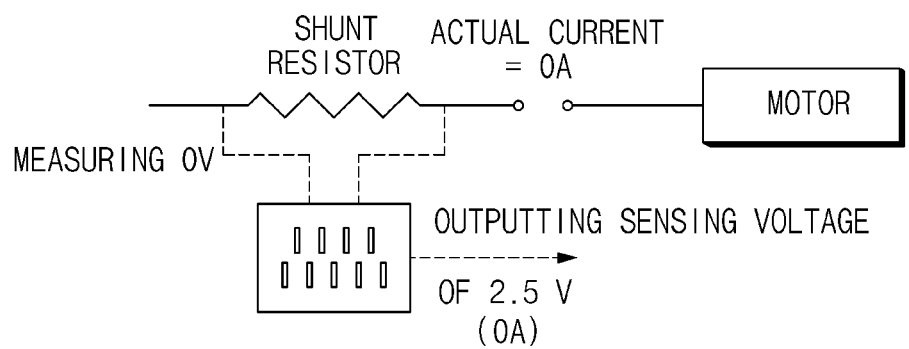
FIG. 5A is a diagram illustrating a situation in which a cable connected to a driving device is opened, according to an embodiment of the present disclosure.
Figure 5B:
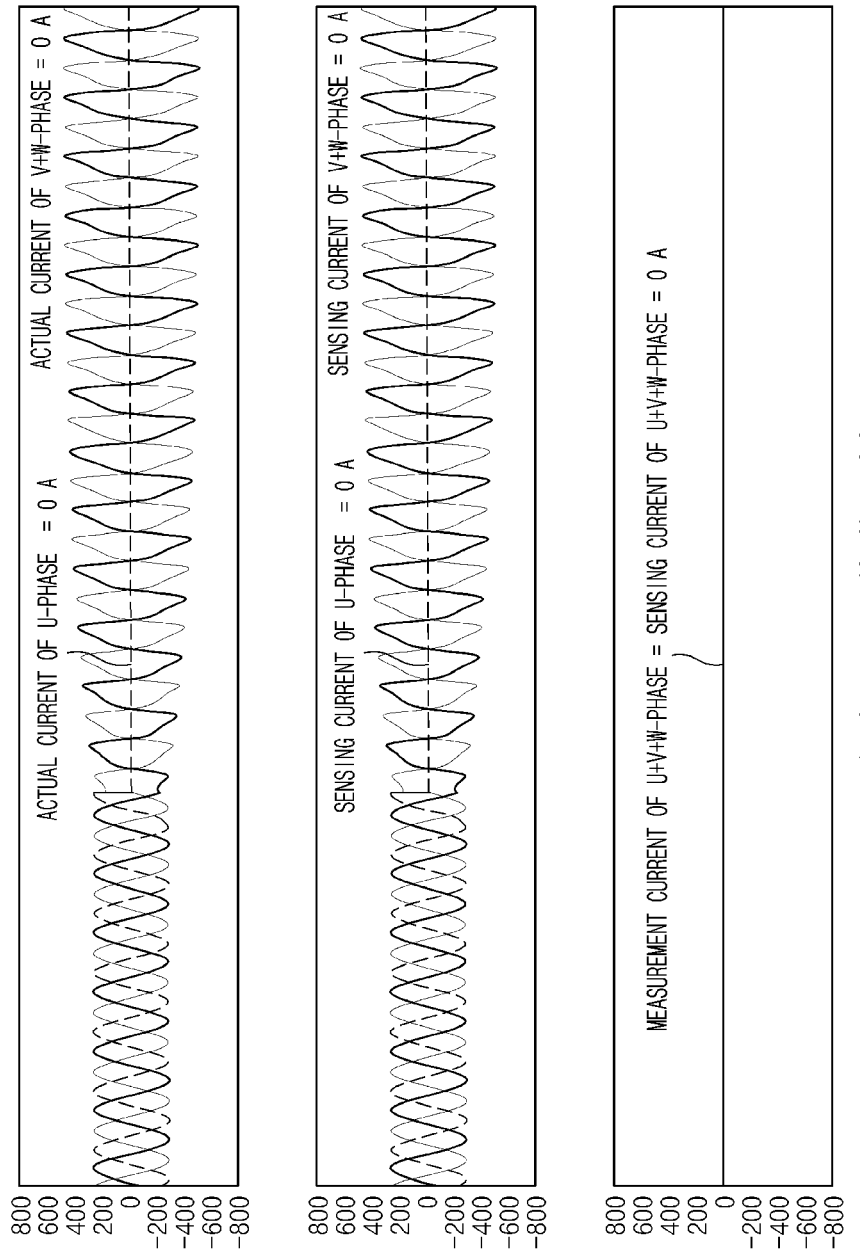
FIG. 5B is a view illustrating an inverter current when the cable of FIG. 5A is opened.

FIG. 5A is a diagram illustrating a situation in which a cable connected to a power circuit, that is, a driving device is opened, according to an embodiment of the present disclosure. FIG. 5B is a view illustrating an inverter current when the cable of FIG. 5A is opened.

As illustrated in FIG. 5A, when an error (fault) such as the opened cable 30 occurs, the actual U-phase current is 0 A, and the sensing current is also 0 A. In this case, because the sensing current is 0 A, the same sensing result as the result in the case of the short of the shunt resistor 100 of FIG. 4A is shown.

As illustrated in FIG. 5A, when the cable 30 is opened, the shunt resistor 100 is normal, and thus the sensing current and the actual current of U-phase may be the same as 0 A. This may be seen through the first and second waveforms of FIG. 5B.

Furthermore, according to Kirchhoff's law, the sum of the actual 3-phase currents is 0 A, and the sensing current is the same as 0 A (the third waveform in FIG. 5B).

As described above, when the shunt resistor is used to detect a current, a situation similar to a case where the cable is disconnected, (i.e., the cable is opened) may occur due to the phenomenon that the sensing voltage of the sensing circuit, that is, the voltage sensing device is fixed to a specific value corresponding to 0 A, or the minimum voltage and the maximum voltage are repeated, when an error occurs. Accordingly, the error may be determined or repaired incorrectly.

According to an embodiment of the present disclosure, the sensing controller 300 of the error determining apparatus may determine whether the shunt resistor 100 is faulty and the cable 30, based on the actual current and sensing current, and the sensing voltage corresponding to the actual current and sensing current.

Figure 6:
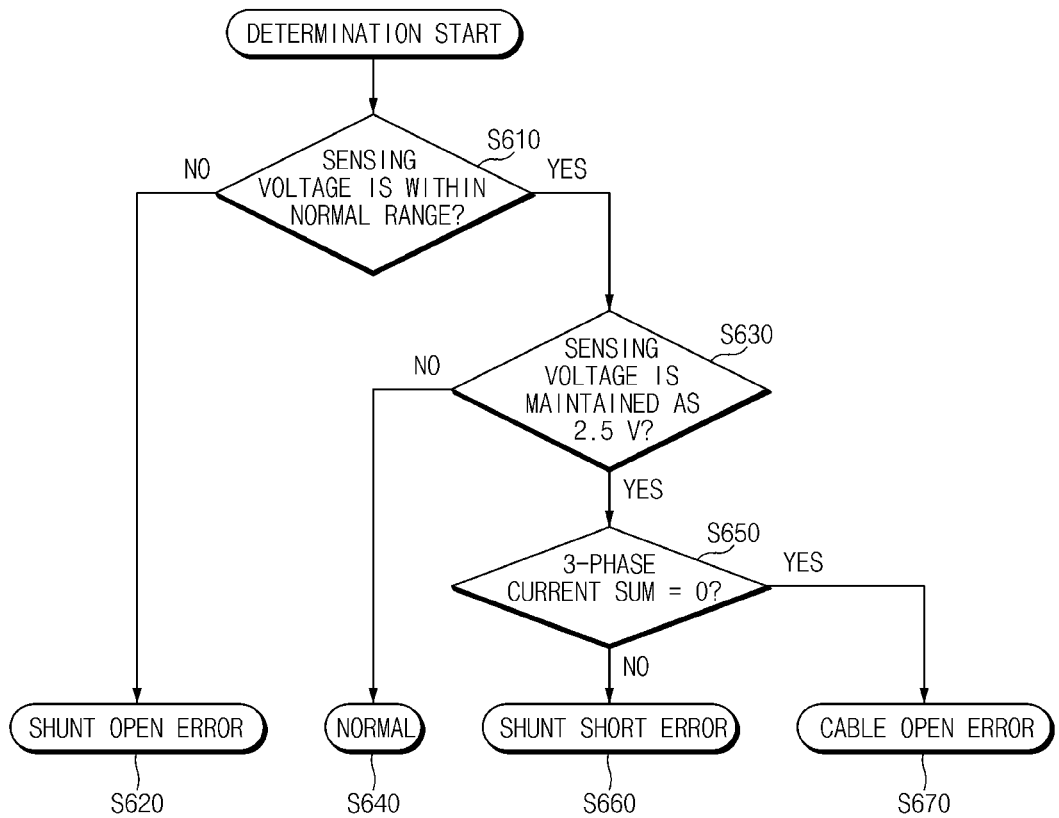
FIG. 6 is a control flowchart for describing an error determining method according to an embodiment of the present disclosure.

FIG. 6 is a control flowchart for describing an error determining method according to an embodiment of the present disclosure. According to an embodiment of the present disclosure, an error controlling method will be described with reference to FIG. 6 as follows.

Above all, the sensing controller 300 may determine whether the sensing voltage sensed by the voltage sensing device 200 is out of a predetermined normal range (S610).

When the sensing voltage is out of the normal range, the sensing controller 300 may determine that the shunt resistor 100 is opened (S620).

According to an embodiment, the normal range may be set to 0.5~4.5V; when the sensing voltage is alternated between the minimum and maximum values that are out of the normal range, as illustrated in FIG. 3B, the sensing controller 300 may determine the shunt resistor 100 as an open error.

On the other hand, when the sensing voltage is within the normal range, the sensing controller 300 may determine whether there is an error in shunt resistor, based on whether the sensing voltage is within the predetermined error voltage range (S630).

As illustrated in FIG. 6, the predetermined error voltage range may be set to a specific value, such as 2.5 V, or may be set to a threshold range including a specific value.

When the sensing voltage is not maintained as a value (e.g., 2.5 V), which is out of the error voltage range, within the normal range, the sensing controller 300 may determine that the shunt resistor 100 is normal (S640).

That is, when the sensing voltage is within the normal range and is not a sensing voltage output when the sensing current is 0 A, the sensing controller 300 may determine that the shunt resistor 100 is in a normal state where no error occurs.

However, when the sensing voltage is maintained as a value within the error voltage range, the sensing controller 300 may additionally consider whether the 3-phase current sum of the inverter 120 is 0 A to distinguish between the short of the shunt resistor 100 and the opened cable 30 (S650).

In other words, the sensing controller 300 may determine whether the shunt resistor 100 is shorted or whether an error occurs in the cable 30, based on whether the sensing voltage is within the predetermined error voltage range.

When the sensing voltage is maintained as a value within the error voltage range, and the 3-phase current sum is not equal to zero, the sensing controller 300 may determine that the shunt resistor 100 is shorted (S660).

When the shunt resistor 100 is shorted, as illustrated in FIG. 4B, the actual current flowing into the cable 30 of U-phase is measured to be not 0 A, the sensing current of shunt resistor 100 is sensed as 0 A.

On the other hand, when the sensing voltage is maintained as a value within the error voltage range, and the 3-phase current sum is equal to zero, the sensing controller 300 may determine that the cable 30 is opened (S670).

When the cable 30 is opened, as illustrated in FIG. 5B, the actual current flowing into the cable 30 of U-phase is measured as 0 A, the sensing current of shunt resistor 100 is also sensed as 0 A.

In summary, an error determining method according to an embodiment of the present disclosure divides the sensing voltage ranges at opposite ends into the normal range, the specific error voltage range, and the 3-phase current sum, using the shunt resistor 100 and determines an error in each case. In particular, it may be distinguished from the short error of the shunt resistor 100, by determining the open error of the cable 30 when the 3-phase current sum is 0 A.

Figure 7:
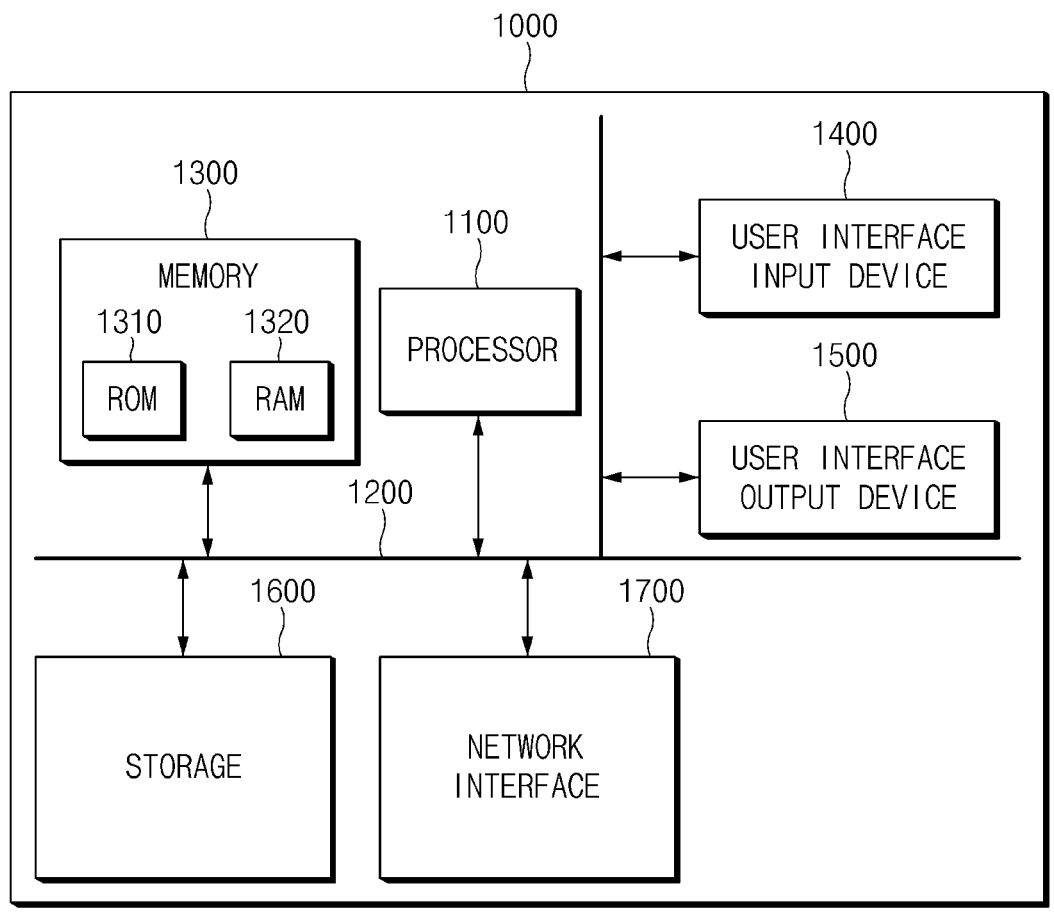
FIG. 7 illustrates a computing system according to an embodiment of the present disclosure.

FIG. 7 illustrates a computing system according to an embodiment of the present disclosure.

Referring to FIG. 7, a computing system 1000 may include at least one processor 1100, a memory 1300, a user interface input device 1400, a user interface output device 1500, storage 1600, and a network interface 1700, which are connected with each other via a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a read only memory (ROM) and a random access memory (RAM).

Thus, the operations of the method or the algorithm described in connection with the embodiments disclosed herein may be embodied directly in hardware or a software module executed by the processor 1100, or in a combination thereof. The software module may reside on a storage medium (that is, the memory 1300 and/or the storage 1600) such as a RAM, a flash memory, a ROM, an EPROM, an EEPROM, a register, a hard disk, a removable disk, and a CD-ROM The exemplary storage medium may be coupled to the processor 1100, and the processor 1100 may read information out of the storage medium and may record information in the storage medium. Alternatively, the storage medium may be integrated with the processor 1100. The processor and the storage medium may reside in an application specific integrated circuit (ASIC). The ASIC may reside within a user terminal. In another case, the processor 1100 and the storage medium may reside in the user terminal as separate components.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, the exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

The present technology provides an error determining apparatus that determines an error and the reason thereof in consideration of the operating feature of a shunt resistor current sensor, and an error determining method.

In an embodiment of the present disclosure, it is possible to provide an error determining apparatus capable of solving the incorrect determination overlapping with a method of determining the cutout of a cable connected to a motor or inverter, and an error determining method.

In an embodiment of the present disclosure, it is possible to provide an error determining apparatus capable of not only replacing the performance compared to the conventional hall sensor, but also reducing costs by applying shunt resistor, and an error determining method.

Besides, a variety of effects directly or indirectly understood through the disclosure may be provided.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An error determining apparatus of a driving device including a motor and a 3-phase inverter supplying power to the motor through a 3-phase cable, the error determining apparatus comprising:
   resistors provided in each phase of the 3-phase cable;
   a voltage sensing device configured to sense voltage of opposite ends of each resistor by a current flowing into the resistors; and
   a sensing controller configured to determine whether any of the resistors is faulty or whether the 3-phase cable is opened, based on the sensing voltages of the voltage sensing device and a 3-phase current sum of the 3-phase inverter,
   wherein the sensing controller is configured to determine either that the any of the resistors is faulty or that the 3-phase cable is opened, based on the 3-phase current sum being equal to zero in response to the sensing voltage of the each resistor being maintained as a value within a predetermined error voltage range.

2. The error determining apparatus of claim 1, wherein the sensing controller determines the any of the resistors is faulty or whether the 3-phase cable is opened based on whether the sensing voltage of the each resistor is within the predetermined error voltage range.

3. The error determining apparatus of claim 2, wherein the sensing controller determines that the each resistor is opened when the sensing voltage of the each resistor is out of a predetermined normal range.

4. The error determining apparatus of claim 2, wherein the sensing controller determines that the each resistor is normal when the sensing voltage of the each resistor is maintained as a value that is out of the error voltage range within a predetermined normal range.

5. The error determining apparatus of claim 4, wherein the sensing controller determines that the each resistor is shorted when the sensing voltage of the each resistor is maintained as a value within the error voltage range and the 3-phase current sum is not equal to zero.

6. The error determining apparatus of claim 4, wherein the sensing controller determines that a cable including a resistor having the sensing voltage in the 3-phase cable is opened when the sensing voltage of the each resistor is maintained as a value within the error voltage range and the 3-phase current sum is equal to zero.

7. An error determining method of a driving device including a motor and a 3-phase inverter supplying power to the motor through a 3-phase cable, the error determining method comprising:
   sensing, by a voltage sensing device, voltage of opposite ends of each resistor of resistors provided in each phase of the 3-phase cable by a current flowing into the each resistor; and
   determining, by a sensing controller, whether any of the resistors is faulty or whether the 3-phase cable is opened, based on the sensed sensing voltages and a 3-phase current sum of the 3-phase inverter,
   wherein determining whether the any of the resistors is faulty includes:
   determining either that the any of the resistors is faulty or that the 3-phase cable is opened, based on the 3-phase current sum being equal to zero in response to the sensing voltage of the each resistor is maintained as a value within a predetermined error voltage range.

8. The error determining method of claim 7, wherein determining whether the any of the resistors is faulty includes:
   determining whether the any of the resistors is faulty or whether the 3-phase cable is opened based on whether the sensing voltage of the each resistor is within the predetermined error voltage range.

9. The error determining method of claim 8, wherein determining whether the any of the resistors is faulty includes:
   determining that the each resistor is opened when the sensing voltage of the each resistor is out of a predetermined normal range.

10. The error determining method of claim 8, wherein determining whether the any of the resistors is faulty includes:
    determining that the each resistor is normal when the sensing voltage of the each resistor is maintained as a value that is out of the error voltage range within a predetermined normal range.

11. The error determining method of claim 10, wherein determining whether the any of the resistors is faulty includes:
    determining whether the each resistor is shorted when the sensing voltage of the each resistor is maintained as a value within the error voltage range and the 3-phase current sum is not equal to zero.

12. The error determining method of claim 10, wherein determining whether the any of the resistors is faulty includes:
    determining that a cable including a resistor having the sensing voltage in the 3-phase cable is opened when the sensing voltage of the each resistor is maintained within an error voltage range and the 3-phase current sum is equal to zero.

* * * * *